United States Patent [19]

Kubota

[11] 4,379,207
[45] Apr. 5, 1983

[54] AUTOMATIC NOISE ELIMINATING DEVICE FOR AN FM RECEIVER

[75] Inventor: Masaki Kubota, Yokohama, Japan

[73] Assignee: Nissan Motor Company, Ltd., Yokohama, Japan

[21] Appl. No.: 187,712

[22] Filed: Sep. 16, 1980

[30] Foreign Application Priority Data

Sep. 17, 1979 [JP] Japan ............................ 54-126993[U]

[51] Int. Cl.³ ............................................. H04H 5/00
[52] U.S. Cl. .............................. 179/1 GJ; 179/1 GD; 179/1 P
[58] Field of Search ............. 179/1 GC, 1 GD, 1 GJ, 179/1 GM, 1 P

[56] References Cited

U.S. PATENT DOCUMENTS 3,952,161  4/1976  Gilbert et al. .................... 179/1 GJ
4,029,906  6/1977  Takahashi ......................... 179/1 GJ
4,037,057  7/1977  Ogita et al. ....................... 179/1 GJ

FOREIGN PATENT DOCUMENTS 55-28685  2/1980  Japan ................................ 179/1 GJ Primary Examiner—R. J. Hickey
Attorney, Agent, or Firm—Schwartz, Jeffery, Schwaab, Mack, Blumenthal & Koch

[57] ABSTRACT

In an FM receiver having cutoff circuits for cutting off higher frequency signal components of an audio signal, and for reducing stereo separation between channels, there is provided a multipath detector for detecting an amplitude modulated FM intermediate frequency signal and outputting a control signal depending on the magnitude of the amplitude modulated FM intermediate frequency signal into the cutoff circuit so that the high frequency noise due to multipath transmission can be eliminated. The invention is particularly suited to use with a stereo FM receiver mounted in an automotive vehicle, but may equally be applied to a mono receiver, or a receiver in any location.

4 Claims, 2 Drawing Figures

AUTOMATIC NOISE ELIMINATING DEVICE FOR AN FM RECEIVER

BACKGROUND OF THE INVENTION

1. Field of the Invention

The present invention relates generally to an automatic noise eliminating device incorporated into an FM receiver, and more specifically to a device incorporated into an FM receiver for eliminating higher frequency noise from an FM audio signal generated by multipath transmission.

2. Description of the Prior Art

The field strength of an electric wave of frequency approximately 100 MHz used for FM broadcasting purposes becomes weaker as the distance from the transmitting station increases. However, if the FM receiving station is located on top of a hill, for example, the field strength will be greater than if the receiving station is located at the same distance, but in a valley or surrounded by high buildings.

Consequently, the field strength depends on the environment of the FM receiving station and the signal to noise ratio of the FM receiver (hereinafter abbreviated as S/N ratio) changes according to the field strength.

Conventional FM receivers may be provided with noise eliminating circuits for compensating for the changes in the S/N ratio.

A brief description will be made of a conventional FM receiver.

The FM intermediate frequency signal IF fed from a high frequency amplifier circuit and a frequency mixing circuit, etc., is amplified by an FM intermediate frequency amplifier, by an amplitude limiter, demodulated by an FM detector, and, in a multiplex system, separated by a stereo decoder into signals for two channels; left L and right R. The demodulated output signal is fed into a deemphasis circuit, where the gain of the high frequency components is lowered to return the overemphasized high frequency components in a preemphasis circuit of an FM transmitter to the original gain.

These two-channel signals are finally amplified by audio frequency amplifiers, respectively.

At the same time, the FM intermediate frequency signal IF' produced by the FM intermediate frequency amplifier is demodulated by an AM detector to produce an envelope signal depending on the amplitude variation (of frequency roughly 20 Hz to 100 Hz) corresponding to the changes in field strength appearing for the reason described above.

This signal is fed into a control circuit, which produces a control voltage according to the input signal level. The control voltage is applied to three attenuators to control the amount of attenuation. The attenuators comprise, e.g., voltage-resistance converters. One attenuator is connected from ground to each output terminal of the stereo decoder via a capacitor allowing only high frequency signals to pass. The third attenuator is connected across the two output terminals of the stereo decoder via a high frequency bypass stereo separation capacitor.

When the field strength becomes weak and the output FM audio signal is low, the high frequency region of the FM audio output signal from the stereo decoder is attenuated and the stereo separation degree is reduced, in order to improve the S/N ratio of the FM receiver.

However, such conventional FM receivers have a shortcoming; since the coupling factors of the three capacitors are changed in response to the field strength variation in the relatively low frequency region, in order to reduce noise generated as described above, the amplitude modulated signal noise (1 to 50 KHz) of the carrier of the directly received wave caused by reflected signals is not filtered out, so that such noise due to multipath transmission cannot be eliminated.

Noise due to multipath transmission has a particularly serious influence on an FM receiver mounted in an automotive vehicle, which while moving about remarkably changing environment is often subjected to multipath transmission.

SUMMARY OF THE INVENTION

With the above described shortcoming in mind, it is an object of the present invention to provide an automatic noise eliminating device for an FM receiver, particularly one mounted in an automotive vehicle. The automatic noise eliminating device detects the amplitude modulated signal component from the FM intermediate frequency signal caused by the multipath transmission and cuts off the high frequency region of the audio signal automatically according to the magnitude of the detected signal level, and in a multiplex stereo system reduces the stereo separation between two channel audio signals in the high frequency region.

BRIEF DESCRIPTION OF THE DRAWINGS

The features and advantages of the noise eliminating device according to the present invention will be better appreciated from the following description taken in conjunction with the accompanying drawings in which like reference numerals designate corresponding elements, and in which.

DESCRIPTION OF THE PREFERRED EMBODIMENTS

Reference will be made to the drawings, and first to FIG. 1 which shows a block diagram of a conventional FM receiver with a noise eliminating device of the prior art.

Figure 1:
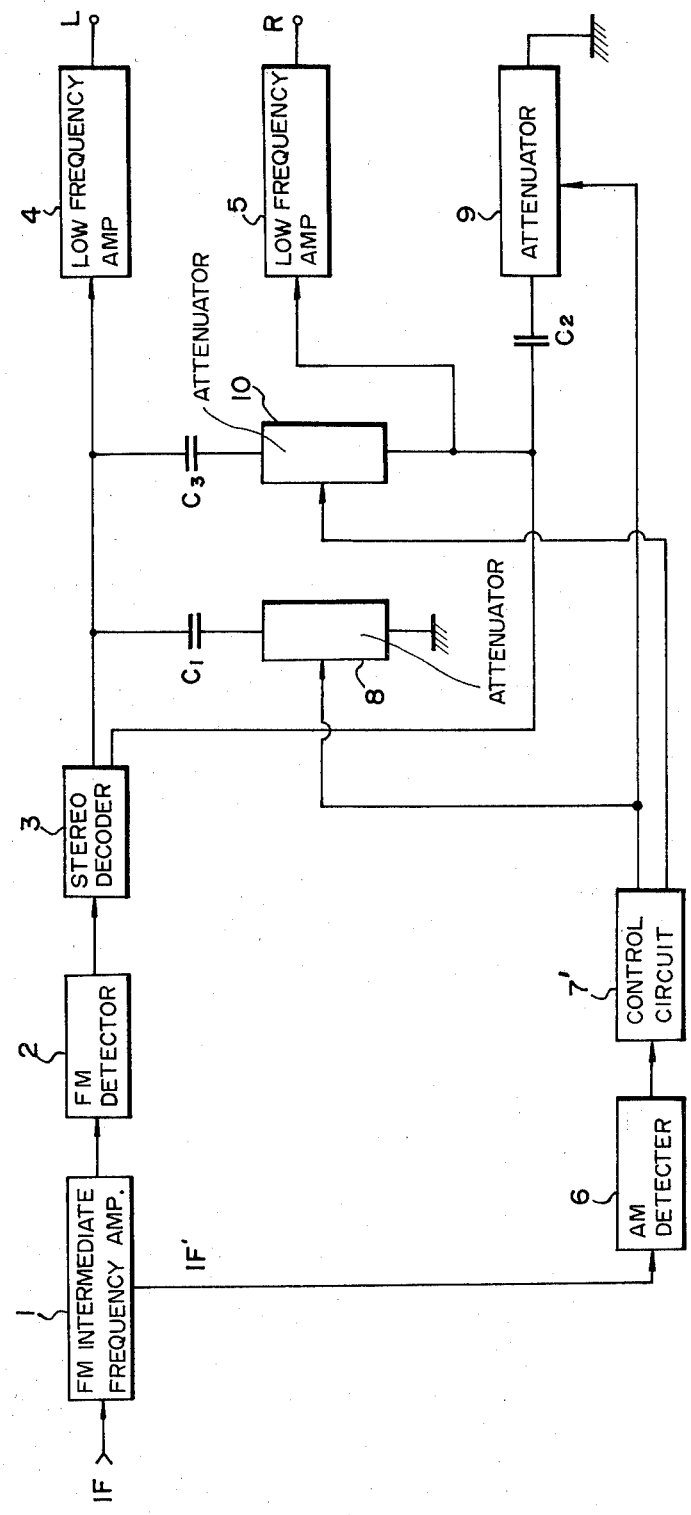
FIG. 1 is a block diagram of a part of FM receiver into which a conventional noise eliminating device is incorporated; and, FIG. 2 is a block diagram of a preferred embodiment of the noise eliminating device according to the present invention in the FM receiver shown partly in FIG. 1.

In FIG. 1, numeral 1 denotes an FM intermediate frequency amplifier which amplifiers an FM intermediate frequency signal IF produced by a front end section of the receiver, which is not shown in the drawing. Numeral 2 denotes an FM detector which demodulates the FM signal, after suppressing the amplitude fluctuations with an amplitude limiter. Numeral 3 denotes a stereo decoder which separates the demodulated FM signal into two multiplexed signals, one the left channel signal and the other the right channel signal for a stereo multiplex FM receiver. Numeral 4 and numeral 5 denote low frequency amplifiers. An AM detector 6 demodulates the intermediate frequency signal IF' which includes an echo signal caused by multipath transmission. Next, a control circuit 7 produces a control voltage according to the level of the output signal from the AM detector 6. Numerals 8, 9, and 10 denote attenuators such as voltage-to-resistance convertors. The control voltage from the control circuit 7 is fed to the attenuators 8, 9, and 10 to control the amount of attenuation.

The attenuator 8 and a capacitor $C_1$ are connected serially between the left channel output of the stereo decoder 3 and ground, and bypasses, under controlled attenuation, the high frequency signal components to act as a high frequency cutoff device in the output section to the left channel low frequency amplifier 4. The combination of an attenuator 9 and $C_2$ forms, in exactly the same way, a high frequency cutoff device in the right channel output. The attenuator 10 and a capacitor $C_3$ connected in series between the left and right channel outputs of the stereo decoder 3 act in a similar way to reduce the stereo separation in the high frequency region. The change in the amount of attenuation enables the coupling factors of these capacitors to be changed so that the high frequency region of an output audio signal is suitably cancelled and the degree of stereo separation is suitably reduced.

However, such a conventional FM receiver noise eliminating device has a shortcoming: since the coupling factors of the capacitors $C_1$, $C_2$, and $C_3$ are changed according to the variation of field strength in the relatively low frequency region in order to reduce noise, the amplitude modulated part of the FM signal carrier wave produced by multipath transmission (from 1 to 50 KHz) is not taken into consideration and, therefore, noise caused by multipath transmission is not eliminated. In particular, an FM receiver mounted in an automotive vehicle is seriously affected by multipath transmission, thereby posing a serious problem.

Figure 2:
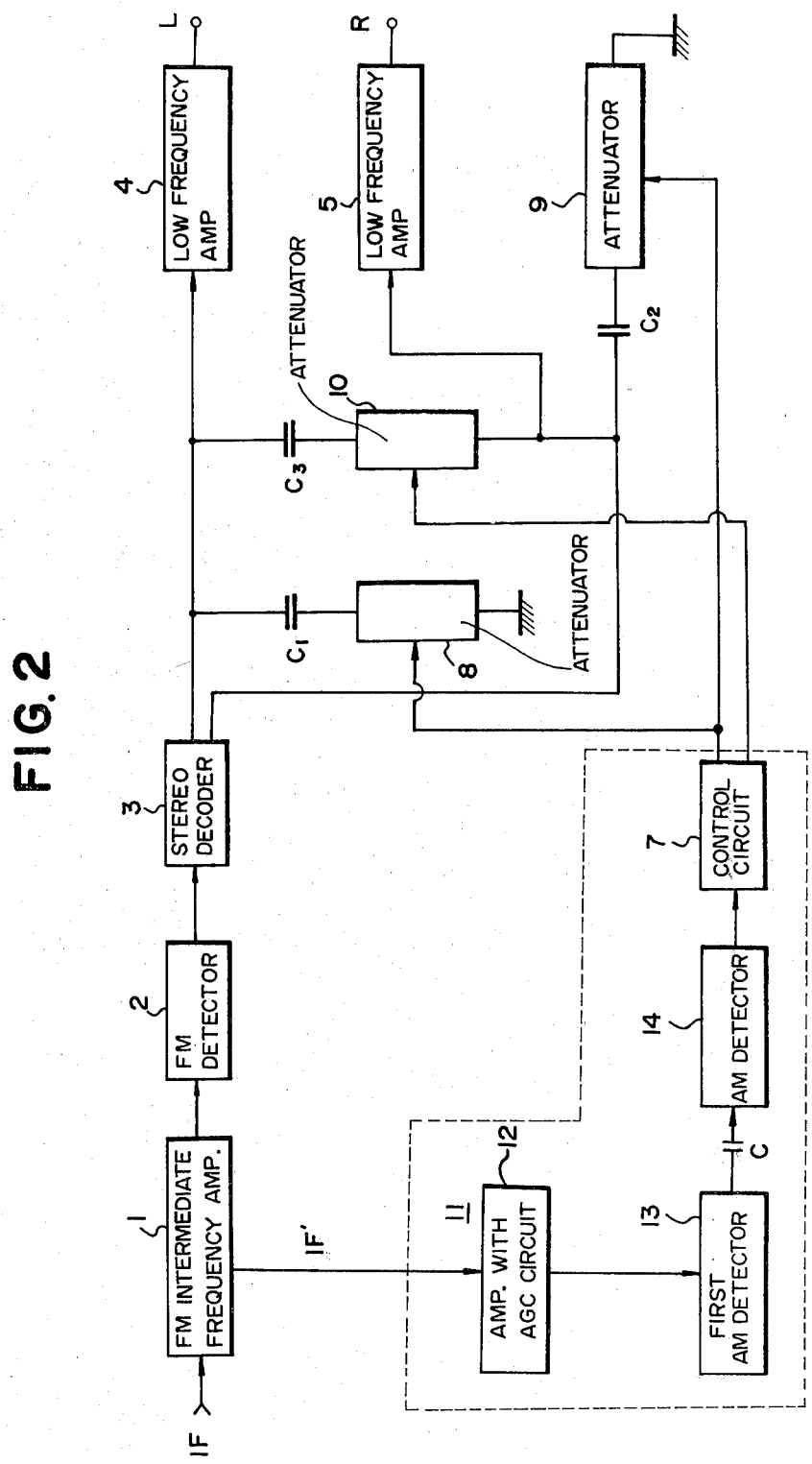

FIG. 2 shows a preferred embodiment of the present invention in an FM receiver. Only the portions of the device of FIG. 2 which distinguish it from the conventional device shown in FIG. 1 will be explained here.

In FIG. 2, numeral 11 denotes a multipath detector which detects the amplitude modulated echo signal of an FM intermediate frequency signal and outputs a control signal (voltage) according to the magnitude thereof. The first stage of the multipath detector 11 is an amplifier 12 which includes an automatic gain control circuit. The output from this amplifier 12 is fed to a first AM detector 13, which produces an envelope signal representing the amplitude modulated frequency component due to multipath transmission. This envelope signal is then fed through a capacitor C, which cuts off the direct current and low frequency fluctuations, to a second AM detector 14. The signal passing through the capacitor C consists of only the amplitude variations with a frequency in the range 1 KHz to 50 KHz which correspond to multipath distortion produced by high buildings and hills. This signal is then again AM detected and smoothed by the second AM detector 14 which thus produces a DC voltage corresponding to the noise level. The final stage of the multipath detector is a control circuit 7' which, from the output voltage of the second AM detector 14, produces appropriate voltages to drive the attenuators 8, 9 and 10.

A photocoupler which combines, e.g., a phototransistor and light emitting diode may be used for attenuators 8 and 9. A bidirectional photocoupler which combines, e.g., a CdS photoconductive cell and a light emitting diode may be used as the attenuator 10.

In the above described preferred embodiment, both high frequency cutoff and the degree of the stereo separation are under control. In alternative embodiments, either of the two may be controlled.

According to the present invention, the noise eliminating device detects an amplitude modulated signal component from the FM intermediate frequency signal generated by the multipath transmission, and also reduces the high frequency region of the output audio signals automatically according to the magnitude of the amplitude modulated signal component.

Consequently, provided the field strength does not fall below a certain level, an FM receiver with the noise eliminating device according to the present invention can provide an audio signal with a superior S/N ratio after eliminating noise due to multipath transmission.

The effect is particularly remarkable when the FM receiver is mounted in an automotive vehicle.

It will be understood by those skilled in the art that the above and other similar modifications may be made in the preferred embodiment described above without departing from the spirit and scope of the present invention, which is to be defined by the appended claims.

What is claimed is:

1. An automatic noise eliminating device for an FM receiver, comprising:
    (a) a multipath detector which detects an amplitude modulated signal caused by multipath transmission in an FM intermediate frequency signal and outputs a control signal according to the magnitude of the amplitude modulated signal, said detector having (1) an amplifier with an automatic gain control circuit connected to an intermediate frequency amplifier of the FM receiver, (2) a first AM detector receiving the output of said amplifier and deriving an envelope signal therefrom, (3) a capacitor through which is fed the envelope signal from said first AM detector and which cuts off low frequency signal components and the direct current component therefrom; and (4) a second AM detector connected in series with said capacitor and detecting a signal including amplitude modulated signal components in the signal passed by the capacitor and outputting a DC voltage signal depending upon the detected signal; and
    (b) at least one high frequency cutoff circuit which cancels higher frequency signal components of an audio signal according to the level of the control signal from said multipath detector.

2. The automatic noise eliminating device for an FM receiver as set forth in claim 1, in which said high frequency cutoff circuit is disposed in each of a pair of audio signal output circuits and further said high frequency cutoff circuit is disposed between said pair of the audio signal output circuits so as to reduce the stereo separation therebetween.

3. The automatic noise eliminating device as set forth in either claim 1 or 2, in which the frequency of the signal detected by said multipath detector is in the range 1 KHz to 50 KHz.

4. The automatic noise elimination device for an FM receiver as recited in claim 1, wherein said high frequency cutoff circuit comprises a capacitor and attenuator having a photocoupler.

* * * * *